United States Patent [19]
Sugiyama

[11] Patent Number: 5,517,435
[45] Date of Patent: May 14, 1996

[54] METHOD OF IDENTIFYING AN UNKNOWN SYSTEM WITH A BAND-SPLITTING ADAPTIVE FILTER AND A DEVICE THEREOF

[75] Inventor: Akihiko Sugiyama, Tokyo, Japan

[73] Assignee: NEC Corporation, Tokyo, Japan

[21] Appl. No.: 208,671

[22] Filed: Mar. 11, 1994

[30]  Foreign Application Priority Data

Mar. 11, 1993 [JP] Japan .................................. 5-050275
Feb. 24, 1994 [JP] Japan .................................. 6-025824

[51] Int. Cl.$^6$ ................................................ G06F 17/10
[52] U.S. Cl. ............................ 364/724.19; 370/32.1
[58] Field of Search ........................ 364/724.19, 724.2; 370/32.1; 379/406, 410, 411

[56] References Cited

U.S. PATENT DOCUMENTS

| | | | |
|---|---|---|---|
| 5,001,701 | 3/1991 | Gay | 370/32.1 |
| 5,136,577 | 8/1992 | Amano et al. | 370/32.1 |
| 5,245,561 | 9/1993 | Sugiyama | 364/724.19 |
| 5,272,695 | 12/1993 | Makino et al. | 370/32.1 |
| 5,329,472 | 7/1994 | Sugiyama | 364/724.19 |
| 5,329,587 | 7/1994 | Morgan et al. | 379/410 |

*Primary Examiner*—David H. Malzahn
*Attorney, Agent, or Firm*—Sughrue, Mion, Zinn, Macpeak & Seas

[57] ABSTRACT

A method and apparatus for identifying an unknown system to provide less computation and a shorter convergence time by controlling the number of taps of adaptive filters corresponding to each subband. The apparatus includes devices for, and the method includes steps of, splitting an input signal to an unknown system and generating a plurality of subband signals, splitting an output signal from the unknown system and generating a plurality of subband reference signals, filtering the subband signals with a plurality of adaptive filters and generating a plurality of replica signals corresponding to the subband reference signals, generating a plurality of subband error signals based on differences between the subband reference signals and the replica signals, updating coefficient values of the adaptive filter using the subband error signals, and adaptively controlling the number of taps of the adaptive filters using data on the adaptive filters.

29 Claims, 14 Drawing Sheets

METHOD OF IDENTIFYING AN UNKNOWN SYSTEM WITH A BAND-SPLITTING ADAPTIVE FILTER AND A DEVICE THEREOF

BACKGROUND OF THE INVENTION

The present invention relates to a method and a device identifying an unknown system such as a transmission path, an acoustic coupling path or the like.

Echo cancellers, noise cancellers, howling cancellers, equalizers and the like are known as applications for unknown system identification with an adaptive filter. Here, using an acoustic echo canceller removing acoustic echo leaking into a microphone from a speaker in an acoustic coupling path as an example, a prior art is explained.

An echo canceller uses an adaptive filter having a larger number of tap coefficients than the impulse response length of an echo path, generates an echo replica corresponding to a transmission signal and reduces acoustic echo leaking into a microphone from a speaker in an acoustic coupling path. At this time, each tap coefficient of the adaptive filter is corrected based on correlation between a far-end signal and an error signal that is obtained by subtracting the echo replica from a mixed signal in which echoes and a near-end signal exist in mixture.

Following papers are known as typical coefficient adaptation algorithms for such an adaptive filter; "LMS Algorithm" (Proceedings of IEEE, pp.1692–1716, Vol.63-No.12, 1975; hereinafter referred to as Paper 1) and "Learning Identification Method; LIM" (IEEE Transactions on Automatic Control, pp.282–287, Vol.12-No.3, 1967; hereinafter referred to as Paper 2).

The impulse response length of the acoustic space where an acoustic echo canceller is actually used is dependent on physical dimensions of the acoustic space and a reflection factor of the wall. For example, assuming a teleconference room, the impulse response length of the room reaches 1,000 taps and sometimes several thousands taps. From the viewpoint of computation and hardware size, realization of such an echo canceller is extremely difficult in this case. Therefore, subband adaptive filters are proposed to solve problems such as increased amount of computation and the like. "IEEE SP Magazine" (pp.14–37, January in 1992; hereinafter referred to as Paper 3).

First, according to a method of Paper 3 shown in FIG. 11, an input signal is divided into a plurality of subbands with an analysis filter bank 3 and subband input signals are generated. This subband input signal is decimated by a factor of $L_1$ in decimation circuits $50_i$ (i=1, 2, ..., K) and is supplied to the adaptive filters $61_i$ (i=1, 2, ..., K) that are independent each other. $L_i$ is usually set as $L_i=K$.

On the other hand, an output of unknown system 2 to be identified, that is an echo of the echo canceller application, is also divided into a plurality of subbands with an analysis filter bank 4 having quite same characteristics as the analysis filter bank 3, becomes a subband echo and decimated by a factor of $L_i$ in the sampling circuits $51_i$(i=1, 2, ..., k).

A subband echo replica is generated from the decimated subband input signal in an adaptive filter $61_i$. A subband error signal that is a difference between this subband echo replica and the decimated subband echo is generated. The adaptive filter $61_i$ uses this subband error signal and performs coefficient update.

This subband error signal is interpolated by a factor of $L_i$ in the interpolation circuits $70_i$ (i=1, 2, ..., K), supplied to the synthesis filter bank 8, synthesized and transmitted to the output terminal 9. Accordingly if a subband error signal is small enough, that is, if a subband echo is suppressed enough in each subband, a signal obtained in the output terminal 9 becomes a full-band signal with a minimum residual echo.

There are various kinds of structures for the adaptive filter $61_i$, however, the most common structure is the FIR adaptive filter. (IEEE Transactions on Acoustics, Speech and Signal Processing, pp.768–781, Vol.27-No.6, 1979. hereinafter referred to as Paper 4).

FIG. 12 a block diagram of an FIR adaptive filter. A subband input signal from the decimation circuit $50_i$ is supplied to the input terminal 610 and a subband reference signal from the decimation circuit $51_i$ is supplied to the input terminal 620. Also, a signal obtained in the output terminal 630 is transmitted to the interpolation circuit $70_i$.

A signal supplied to input terminal 610 is supplied to a tapped delay line comprising a plurality of delay elements $611_1, \ldots, 611_{N-1}$ that generates a delay of one sampling period. A sample of an input signal supplied to the delay element $611_1$ is transferred to a delay element next to at every single clock. The output signal of each delay element $611_i$(i=1, 2, ..., N–1) is supplied to the corresponding multiplier $613_{i+1}$, multiplied by a signal supplied from the corresponding coefficient generation circuit $612_{i+1}$. A signal is supplied to the multiplier $613_i$ directly from the input terminal 610.

After summed up in adder 614 and subtracted from the subband reference signal in subtracter 616, the all output signals of multiplier $613_i, \ldots 613_N$ are transmitted to the output terminal 630.

Assuming the LMS algorithm shown in Paper 1 as the coefficient adaption algorithm, a block diagram that shows configuration of the coefficient generation circuit $612_i$(i=1, 2, ..., N) can be expressed as FIG. 13. A signal from the subtracter 616 in FIG. 12 is supplied to the input terminal 640 and a signal from the input terminal 610 in FIG. 12 is supplied to the input terminal 650 and a signal obtained in the output terminal 660 is transmitted to the multiplier $613_i$ in FIG. 12. Also, a signal from the input terminal 640 and a signal from the input terminal 650 are multiplied in multiplier 641 and the result is supplied to adder 643. Multiplier 644 multiplies the signal supplied from the multiplier 641 by a constant μ, and outputs the result to adder 643. On the other hand, adder 643 is supplied with an output of adder 643 itself delayed one sampling period by delay element 642. Accumulation of values supplied by multiplier 644 is carried out by a loop circuit consisting of delay element 642 and adder 643. Going through this loop circuit once is equivalent to carrying out a single coefficient update.

The number of taps N of the FIR adaptive filter that is explained with FIG. 12 must be equal to or greater than the corresponding impulse response length.

Generally, a subband acoustic echo lower band lasts longer than that in a high band. This is because the impulse response length of an acoustic echo is basically determined by a reflection and the reflection factor for a high band component is smaller than that for a low band resulting in shorter reverberation.

FIG. 14A, FIG. 14B, FIG. 14C and FIG. 14D show examples of a typical impulse response in each band for a 4-band acoustic echo. Assuming the impulse response length in band 1, ..., band 4 are M1, M2, M3 and M4 respectively, $M1 \geq M2 \geq M3 \geq M4$ is satisfied.

In the conventional examples explained above, the number of taps of adaptive filter $61_i$ (i=1, 2, ..., K) is always equal in all subbands and set equal to the number of taps necessary for the subband that requires the largest number.

By this reason, in a subband that needs a smaller number of taps, namely a high subband in general, the number of taps becomes too large, resulting in increased computation and larger convergence time due to interference by excess taps.

SUMMARY OF THE INVENTION

A purpose of the present invention is to offer a method of identifying an unknown system with a subband adaptive filter and a device thereof enabling to reduce computation, shorter convergence time by adaptively controlling the number of adaptive filter taps corresponding to each subband.

The above object is achieved by a method of identifying an unknown system with a subband adaptive filter comprising:

a step of splitting an input signal to an unknown system and generating a plurality of sub-band signals;

a step of splitting an output signal from said unknown system and generating a plurality of subband reference signals;

a step of filtering said subband signals with a plurality of adaptive filters and generating a plurality of replica signals corresponding to said subband reference signals;

a step of generating a plurality of subband error signals based on differences between said subband reference signals and said replica signals;

a step of updating coefficient values of said adaptive filters using said subband error signals; and a step of adaptively controlling a number of taps of said adaptive filters using data on said adaptive filters.

Moreover, it is desirable that said data on respective adaptive filters comprise data on coefficient values of said respective adaptive filters.

Moreover, it is desirable that said data on coefficient values of said respective adaptive filters comprise squares of coefficient values of said respective adaptive filters.

Moreover, it is desirable that said data on coefficient values of said adaptive filters comprise averages of squares of respective coefficient values of said adaptive filters.

Moreover, it is desirable that said data on coefficient values of said respective adaptive filters comprise of absolute values of coefficient values of said respective adaptive filters.

Moreover, it is desirable that said data on coefficient values of said respective adaptive filters comprise averages of absolute values of coefficient values of said respective adaptive filters.

Moreover, it is desirable that said data on said adaptive filters comprise data on subband error signals corresponding to said respective adaptive filters.

Moreover, it is desirable that said data on subband error signals comprise squares of respective subband error signals corresponding to said respective adaptive filters.

Moreover, it is desirable that said data on subband error signals comprise averages of squares of respective subband error signals corresponding to said respective adaptive filters.

Moreover, it is desirable that said data on subband error signals comprise absolute values of respective subband error signals corresponding to said respective adaptive filters.

Moreover, it is desirable that said data on subband error signals comprise averages of absolute values of respective subband error signals corresponding to said respective adaptive filters.

Moreover, it is desirable that said step of adaptive control comprises:

a step of calculating respective squares of coefficient values of said respective adaptive filters and sum of these squares;

a step of calculating values by way of (a square of coefficient value of said adaptive filter)/(sum of said squares) for said respective adaptive filters;

a step of calculating a number of taps of said adaptive filters respectively based on said values;

a step of controlling said number of taps of said respective adaptive filters based on a number of taps calculated in the previous step.

Moreover, it is desirable that said step of adaptive control comprises:

a step of calculating absolute values of coefficient values of said respective adaptive filters and sum of these absolute values;

a step of calculating values by way of (an absolute value of said adaptive filter)/(sum of said absolute values) for said respective adaptive filters;

a step of calculating a number of taps of adaptive filters respectively based on said values;

a step of controlling said number of taps of said respective adaptive filters based on a number of taps calculated in the previous step.

Moreover, it is desirable that said step of adaptive control comprises:

a step of calculating a maximum power and a minimum power from among powers of said subband error signals; and a step of increasing the number of taps of said adaptive filter corresponding to a subband error signal having said maximum power $R_1$ ($R_1$ is integer), and decreasing the number of taps of said adaptive filter corresponding to a subband error signal having said minimum power $R_2$ ($R_2$ is integer).

Moreover, it is desirable that said step of adaptive control comprises:

a step of calculating the magnitudes of subband error signals corresponding to said respective adaptive filters and sum of these magnitudes;

a step of calculating values by way of (a magnitude of subband error signal corresponding to said adaptive filter)/ (sum of said magnitudes) for said respective adaptive filters;

a step of calculating a number of taps of said adaptive filters respectively based on said values;

a step of controlling said number of taps of said respective adaptive filters based on a number of taps calculated in the previous step.

Moreover, it is desirable that said step of adaptive control comprises:

a step of adaptively controlling said number of taps of adaptive filters using said data on adaptive filters and said data on subband reference signals, instead of said step of adaptively controlling said number of taps of adaptive filters using said data on adaptive filters.

Moreover, it is desirable that said data on subband reference signals comprise powers of said subband reference signals.

Moreover, it is desirable that said data on subband reference signals comprise absolute values of said subband reference signals.

Furthermore, it is desirable that said step of adaptive control, in addition of said step of processing said data on adaptive filters, comprises:

a step of calculating powers of said subband reference signals corresponding to respective adaptive filters and sum of these powers;

a step of calculating values by way of (a power of said subband reference signal corresponding to said adaptive filters)/(sum of said powers) for said respective adaptive filters;

a step of calculating number of taps of said adaptive filters respectively based on said values and a processed data on said adaptive filters; and a step of controlling a number of taps of said adaptive filters respectively based on said number of taps calculated in the previous step.

Moreover, it is desirable that said step of adaptive control, in addition of said step of processing said data on adaptive filters, comprises:

a step of calculating absolute values of said subband reference signals corresponding to respective adaptive filters and sum of these absolute values;

a step of calculating values by way of (an absolute value of said subband reference signal corresponding to said adaptive filter)/(sum of said absolute values) for said respective adaptive filters;

a step of calculating number of taps of said adaptive filters respectively based on said values and processed data on said adaptive filters; and a step of controlling a number of taps of adaptive filters respectively based on said number of taps calculated in the previous step.

The above object of the present invention is achieved by a device for identifying an unknown system with a subband adaptive filter comprising:

a first analysis filter bank for dividing a band of an input signal to an unknown system and generating a plurality of subband reference signals;

a second analysis filter bank for dividing a band of an output signal from said unknown system and generating a plurality of subband reference signals;

a plurality of adaptive filters having a coefficient value updating means to update coefficient values based on subband error signals and a tap number updating means to update said tap number based on tap number control signals, filtering said subband signals based on updated coefficient values and tap numbers, and generating a plurality of replica signals corresponding to said subband reference signals;

a plurality of subtracters for calculating respective differences between said subband reference signals and said replica signals and outputting these differences to said coefficient value updating means as said subband error signals;

an analyzer for analyzing data on said adaptive filters; and a tap number control means for calculating a tap number of said adaptive filters based on a result of analysis output from said analyzer, generating said tap number control signals and outputting them to said tap number updating means.

It is to be noted that said analyzer is comprised so as to calculate respective squares of coefficient values of said respective adaptive filters and sum of these squares and said tap number control means is comprised so as to calculate values by way of (a square of coefficient value of said adaptive filter)/(sum of said squares) for said respective adaptive filters and a tap number of said respective adaptive filters based on these values and output said tap number control signals.

Moreover, it is desirable that said analyzer is comprised so as to calculate respective absolute values of coefficient values of said adaptive filters and sum of these absolute values and said tap number control means is comprised so as to calculate values by way of (an absolute value of coefficient value of said adaptive filter)/(sum of said absolute value) for said respective adaptive filters and a tap number of said respective adaptive filters based on these values and output said tap number control signals.

Moreover, it is desirable that said analyzer is comprised so as to calculate respective squares of subband error signals corresponding to said respective adaptive filters and sum of these squares and said tap number control means is comprised so as to calculate values by way of (a square of subband error signals corresponding to said adaptive filter)/(sum of said squares) for said respective adaptive filters and a tap number of said respective adaptive filters based on these values and output said tap number control signals.

Moreover, it is desirable that said analyzer is comprised so as to calculate respective absolute values of subband error signals corresponding to said respective adaptive filters and sum of these absolute values and said tap number control means is comprised so as to calculate values by way of (an absolute number of subband error signals corresponding to said adaptive filter)/(sum of said absolute values) for said respective adaptive filters and a tap number of said respective adaptive filters based on these values and output said tap number control signals.

Moreover, it is desirable that said tap number control means is comprised so as to calculate, based on a result of analysis output from said analyzer and data on said subband reference signals, a tap number of said adaptive filters, generate said tap number control signal and output this signal to said tap number updating means.

Moreover, it is desirable that said tap number control means is comprised so as to receive powers of respective subband reference signals corresponding to said respective adaptive filters and calculate sum of these powers and values by way of (a power of subband reference signal corresponding to said adaptive filter)/(sum of said powers) for said respective adaptive filters, calculate a tap number of said adaptive filters based on these values and a result of analysis output from said analyzer, generate said tap number control signal and output this signal to said tap number updating means.

Moreover, it is desirable that said tap number control means is comprised so as to receive absolute values of respective subband reference signals corresponding to said respective adaptive filters and calculate sum of these absolute values and values by way of (an absolute value of subband reference signal corresponding to said adaptive filter)/(sum of said absolute values) for said respective adaptive filters, calculate a tap number of said adaptive filters based on these ratios and a result of analysis output from said analyzer, generate said tap number control signal and output this signal to said tap number updating means.

Moreover, it is desirable that said tap number updating means comprises a generator for generating a sequence of numbers consisting of 0 and 1 as factors using said tap number control signals and a plurality of switching means for switching ON and OFF for operations at each tap of said adaptive filters, and is comprised so as to turn the operation of a tap corresponding to a switching means ON when this switching means has received 1 of said sequence of numbers, and turn the operation of a tap corresponding to a switching means OFF when this switching means has received 0 of said sequence of numbers.

Moreover, it is desirable that the device for identifying an unknown system with a subband adaptive filter comprises an averaging circuit for averaging data used for analysis before said analyzer works.

Furthermore, it is desirable that the device for identifying an unknown system with a subband adaptive filter comprises a first group of decimation circuits for decimating said subband signals and transmitting them to said adaptive filters and a second group of decimation circuits for decimating said subband reference signals and transmitting them to said subtracters.

Explained as above, the present invention can offer a method of identifying an unknown system with a subband adaptive filter and a device thereof enabling to reduce computations, convergence time by adaptively controlling the number of taps of the adaptive filter corresponding to each subband.

BRIEF DESCRIPTION ON DRAWINGS

DETAILED DESCRIPTION OF THE INVENTION

Referring to figures, the embodiments of the present invention are explained in detail.

Figure 1:
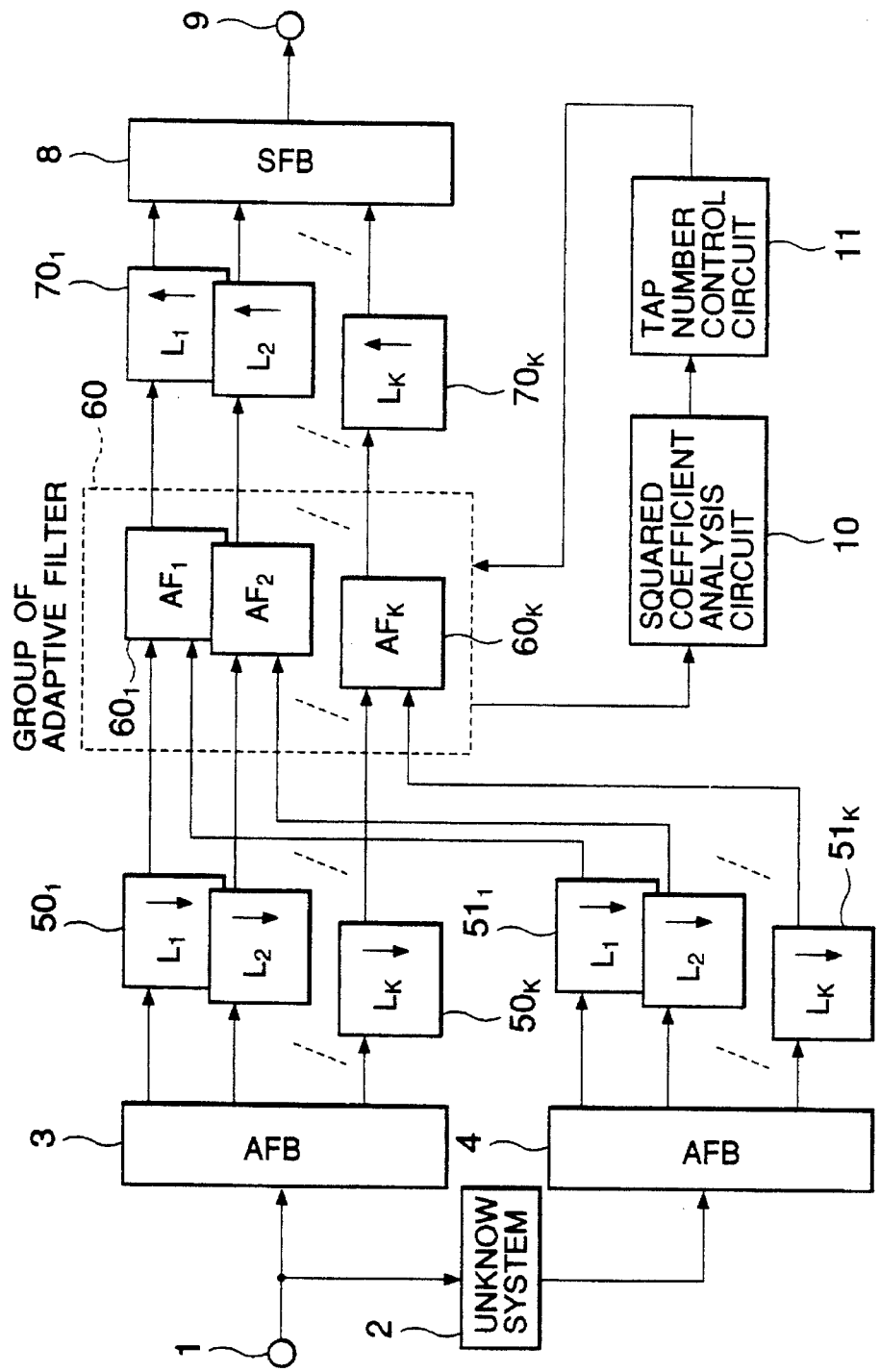
FIG. 1 is a block diagram showing the first embodiment of the present invention.

FIG. 1 is a block diagram showing the first embodiment of the present invention.

The feature of the first embodiment of the present invention is in squared coefficient analysis circuit 10, tap number control circuit 11 and the adaptive filter $61_i$ (i=1, 2, ..., K).

Figure 12:
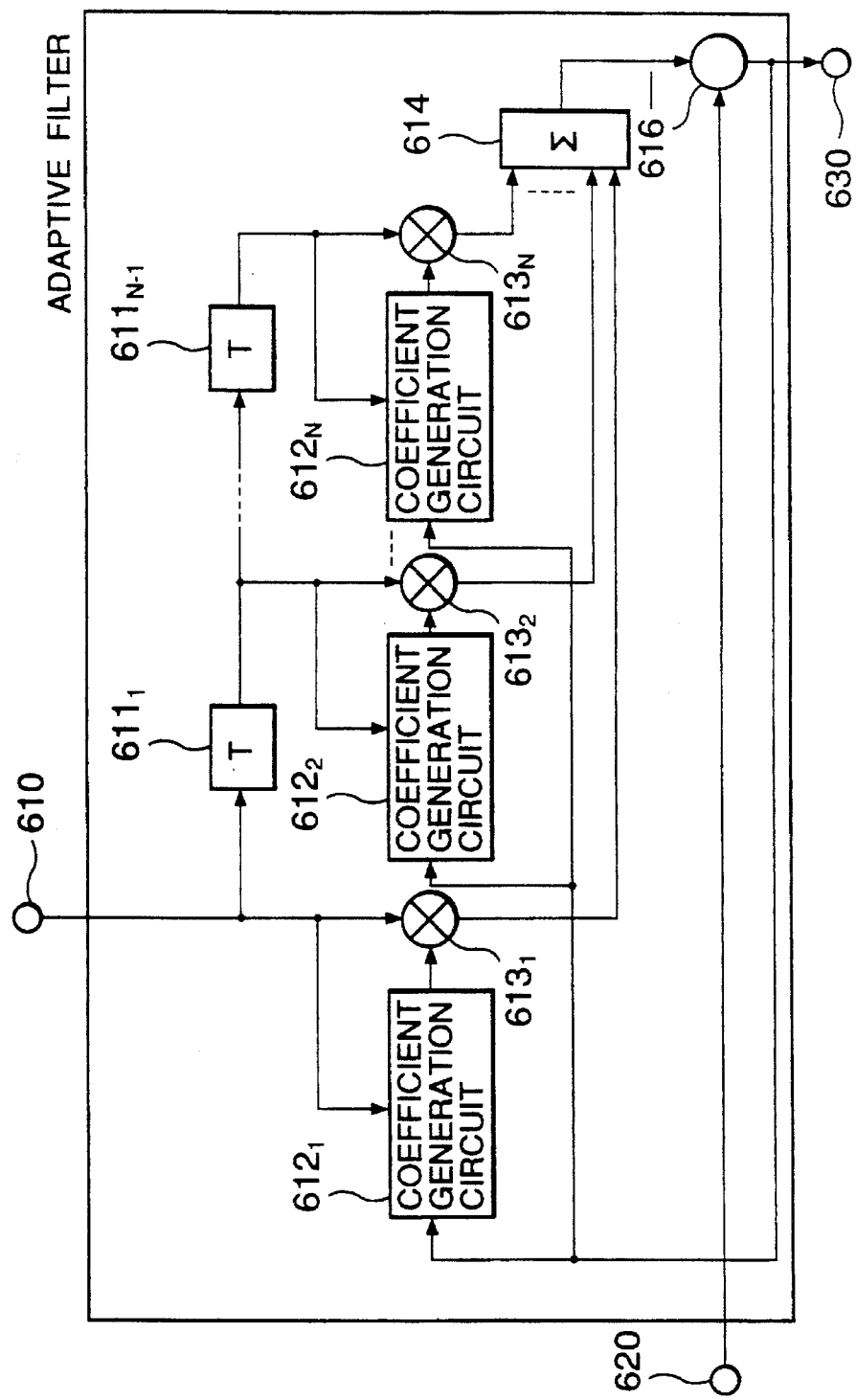
FIG. 12 is a block diagram showing an adaptive FIR filter in an example of prior art.
Figure 13:
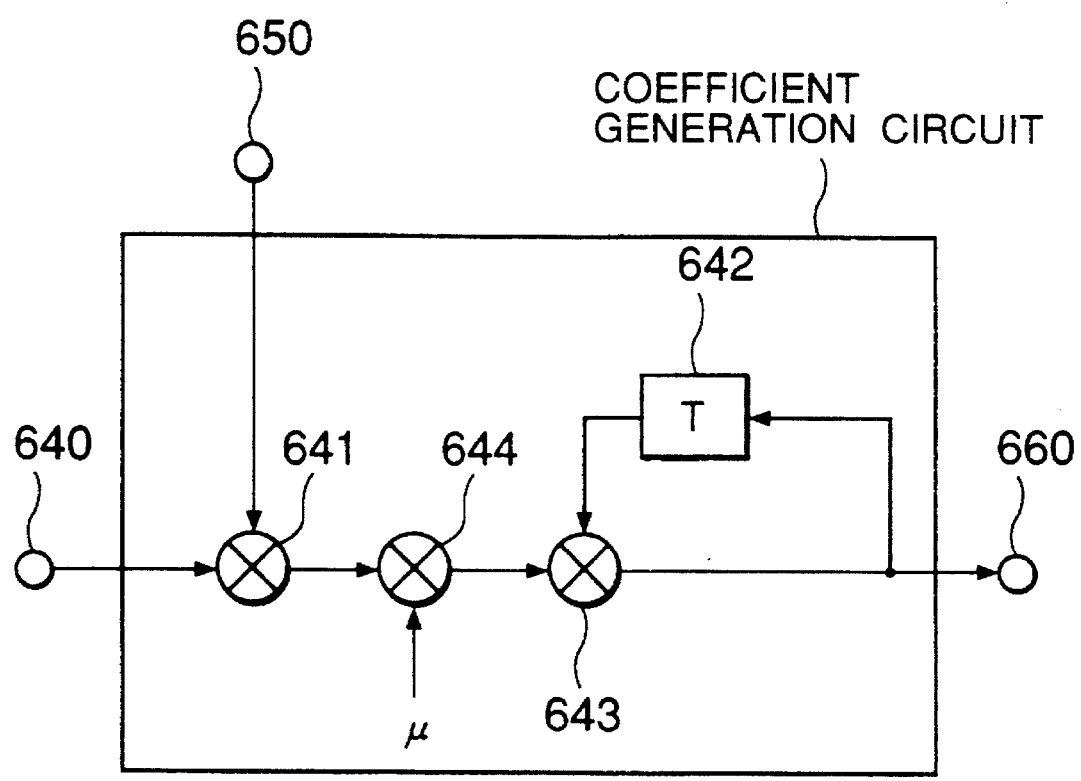
FIG. 13 is a block diagram showing a coefficient generating circuit of the adaptive FIR filter in an example of prior art.
Figure 14:
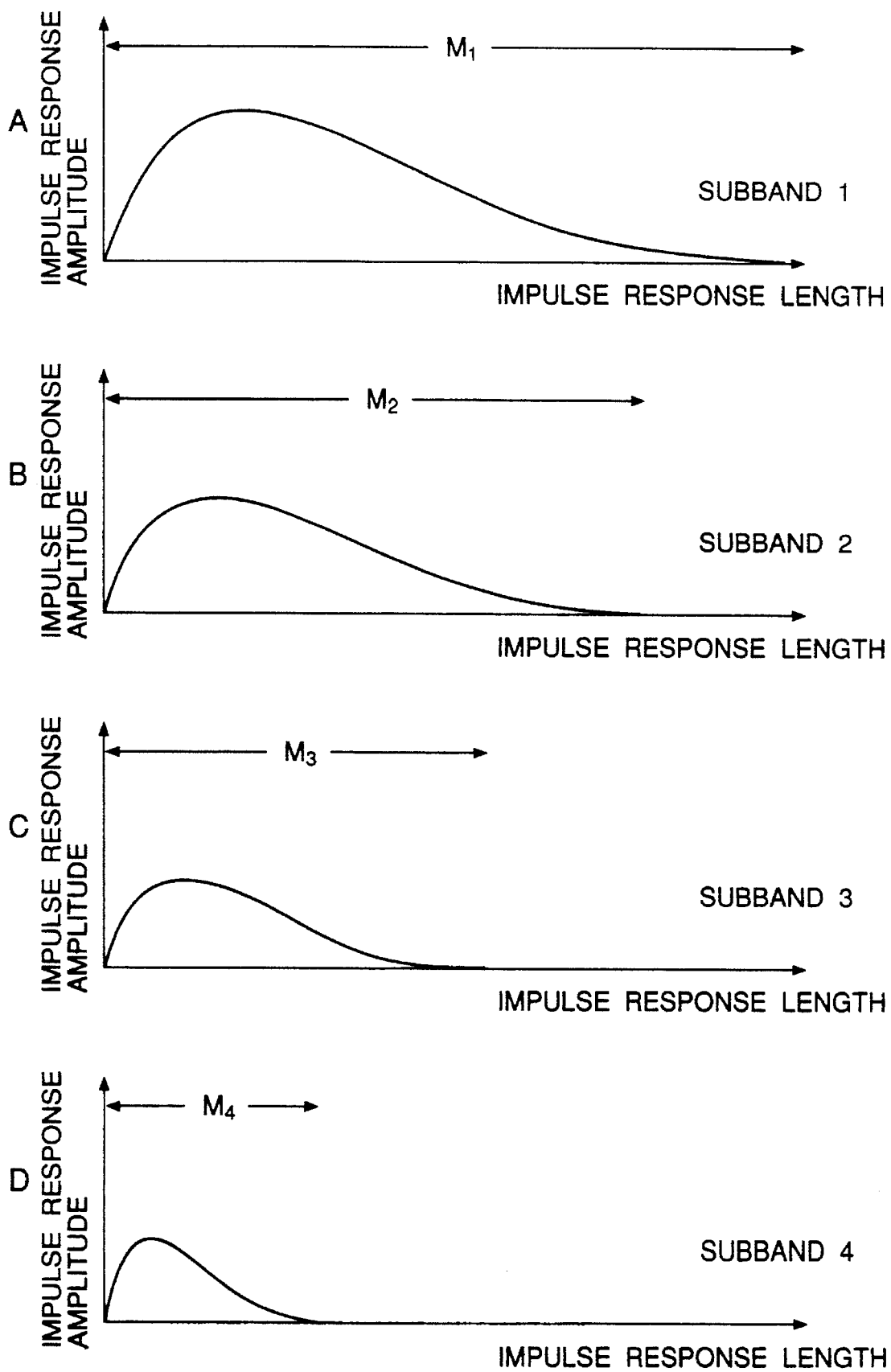
FIG. 14A, FIG. 14B, FIG. 14C and FIG. 14D are examples of subband impulse response.

In addition to configuration of adaptive filter $60_i$ shown in FIG. 12, adaptive filter $61_i$ is organized so as to output each coefficient value of adaptive filter $61_i$ to squared coefficient analysis circuit 10, and control the number of taps. The control of tap number is explained in detail later.

First, assuming a coefficient vector of adaptive filter $61_i$ as $C_i$, a value of each coefficient is defined as mathematical expression (1).

$$c_i = [c_{i,1}\ c_{i,2}\ \ldots\ c_{i,n}]^T \qquad (1)$$

Where, N is a number of taps and $[\bullet]^T$ is the transpose of $[\bullet]$.

The adaptive filter $61_i$ outputs a coefficient value to squared coefficient analysis circuit 10.

Squared coefficient analysis circuit 10 uses the supplied coefficient values and calculates mathematical expression (2) for every each subband.

$$\bar{c}_i = [c_{i,N_i-P+1}\, c_{i,N_i-P+2}\ \ldots\ c_{i,N_i}]^T \qquad (2)$$

Where, P is an integer, $N_i$ is a tap number of an adaptive filter corresponding to the i-th subband. In other words, squared coefficient analysis circuit 10 uses coefficients of the last P taps for analysis in each adaptive filter 61.

Furthermore, squared coefficient analysis circuit 10 calculates mathematical expression 3.

$$\bar{c} = [\bar{c}_1{}^T \bar{c}_1 \bar{c}_2{}^T \bar{c}_2 \ldots \bar{c}_K{}^T \bar{c}_K] \qquad (3)$$

Also, squared coefficient analysis circuit 10 calculates mathematical expression 4 and mathematical expression 5, outputs the result to the tap number control circuit 11.

$$\text{trace}\{\bar{c}\} \qquad (4)$$

$$\bar{c}_i{}^T \bar{c}_i \qquad (5)$$

Tap number control circuit 11 uses the mathematical expressions 4 and 5, and calculates a tap number of each adaptive filter.

Here, using the tap number $N_{i,k}$ at the time k, the tap number $N_{i,k+i}$ at the time k+1 of the adaptive filter $61_i$ corresponding to the i-th subband is obtained by the following expression.

$$N_{i,k+1} = N_{i,k} - R + INT\left[KR \times \frac{\bar{c}_i{}^T \bar{c}_i}{\text{trace}\{\bar{c}\}}\right] \qquad (6)$$

Where, INT[•] is an operator for digitization, trace {•} is a trace of the matrix and R is a tap number eliminated from adaptive filter 61 corresponding to a single subband upon a single tap re-distribution. Here, R is preset in consideration of unknown systems and so on.

Hereupon, the number of taps that could be re-distributed is KP. Depending on the result of digitization, however, the number of taps that could be re-distributed does not necessarily coincide with the number of taps that is actually re-distributed.

Excess or shortage of the number of taps is adjusted by the number of taps of the adaptive filter corresponding to i-th subband giving mathematical expression 7.

$$\min\left[\frac{\bar{c}_i^T \bar{c}_i}{\text{trace}\{\bar{c}\}}\right] \tag{7}$$

Where, min[•] represents a minimum value of [•].

The number of taps of each subband obtained by above calculations is supplied to the adaptive filter $60_i$ (i=1, 2, ..., k).

Next, adaptive filter $60_i$ (i=1, 2, ..., k) is explained in detail.

Figure 2:
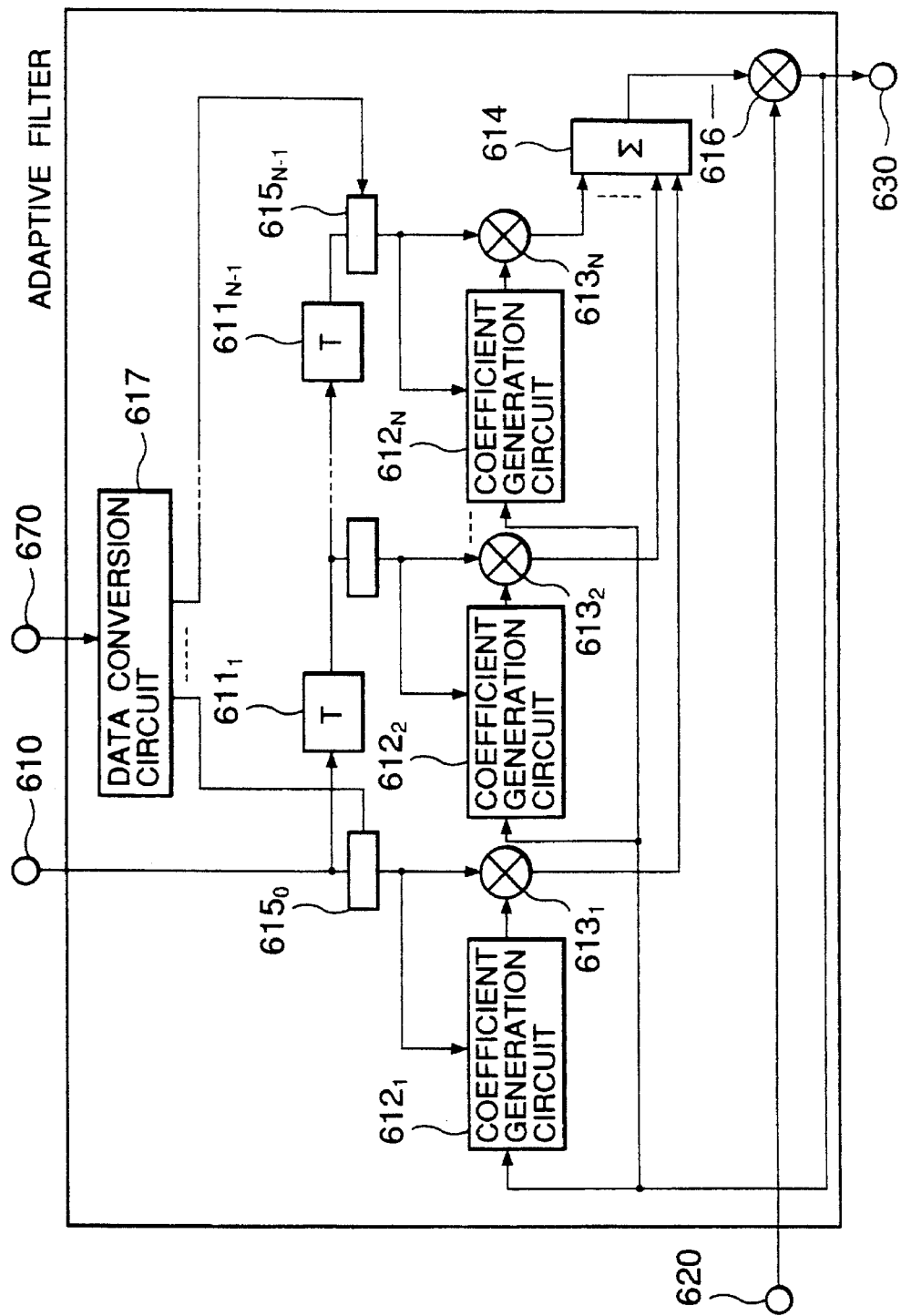
FIG. 2 is a block diagram showing an embodiment of the adaptive filter shown in FIG. 1.

FIG. 2 is a block diagram of adaptive filter $61_i$ (i=1, 2, ..., K). In this figure, the configuration of adaptive filter is the same as adaptive filter $60_i$ shown in FIG. 12 other than switches $615_0, 615_1, \ldots, 615_{N-1}$, data conversion circuit 617 and input terminal 670. Accordingly, only different points are explained later.

The tap number $N_{i,k}$ is supplied to input terminal 670 from tap control circuit 11. Receiving this tap number, data conversion circuit 617 resolves and converts it to control signal controlling switches $615_0, 615_1, \ldots, 615_{N-1}$.

The tap number $N_{i,k}$ is supplied, for example, in a form of $N_{i,k}$=U (U is a positive integer). And data conversion circuit 617 converts the tap number $N_{i,k}$=U, and generates a sequence of numbers whose elements from u to N−1 are 0 and all the others are 1, where $U \leq u \leq U-1$.

Each element of the sequence generated as above is output to a corresponding switch such that the j-th element is supplied to the switch $615_j$. Switches $615_0, 615_1, \ldots, 615_{N-1}$ are configurated so as to open the circuit if 1 is supplied or close the circuit if 0 is supplied. Accordingly switches $615_u, 615_{u+1}, \ldots, 615_{N-1}$ are cut off and signals are not transmitted to multipliers $613_u, \ldots, 613_{N-1}$. This is equivalent to an adaptive filter operation with U taps.

In the above explanation, configurations of analysis filter banks 3, 4 and synthesis filter bank 5 were not explained. Configuration and design of these filter banks are explained in "Proceedings of the IEEE", pp.56–93, Vol.78-No.1, January in 1990 (hereinafter referred as Paper 5) in detail.

Figure 3A:
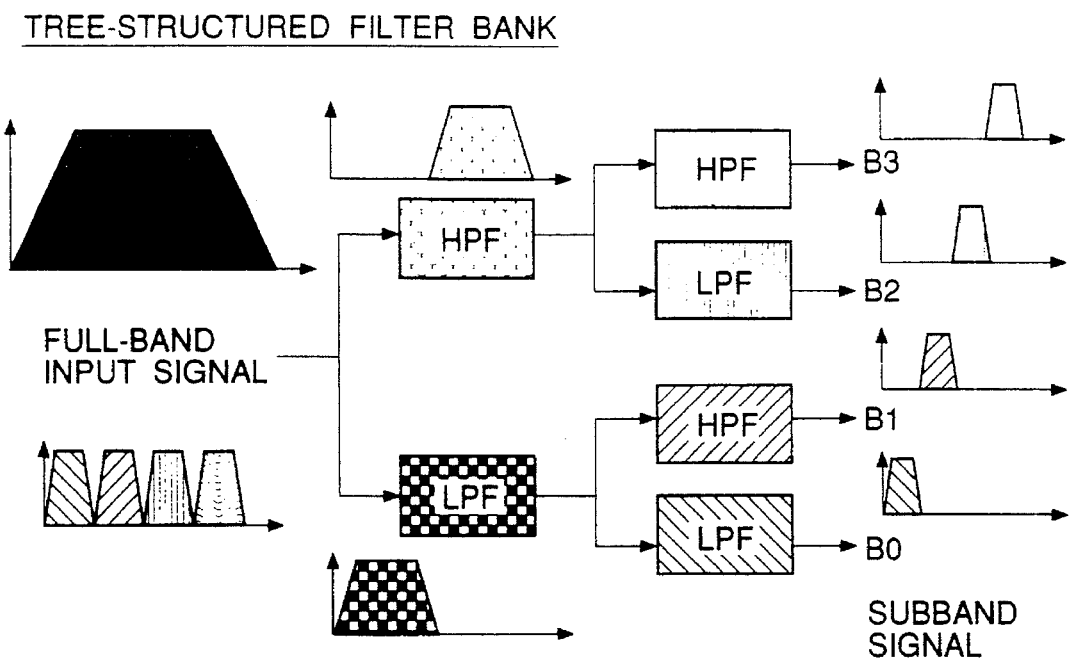
FIG. 3A and FIG. 3B are block diagrams showing a tree-structured filter bank and a polyphase filter bank.
Figure 3B:
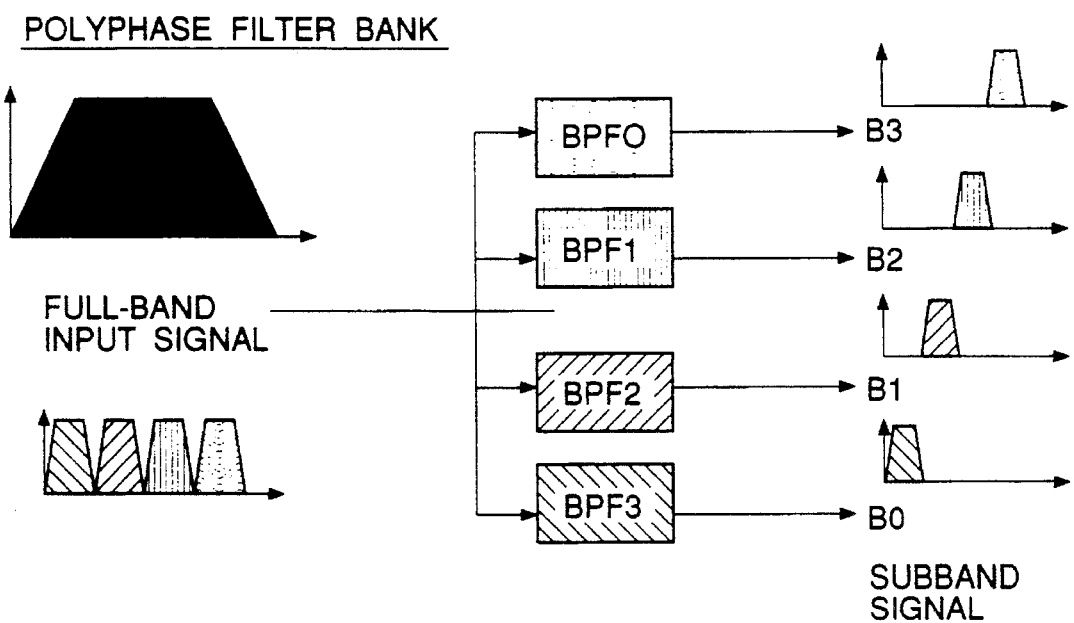

Typical configurations written in this Paper 5 are a tree-structured filter bank and a polyphase filter bank based on QMF (Quadrature Mirror Filter) shown in FIG. 3A and FIG. 3B.

With a tree-structured filter bank, a subband signal is obtained by repeating dividesion of an input signal into 2-band. On the other hand, with a polyphase filter bank, a subband signal is obtained by single-stage band pass filters whose passbands correspond to those obtained finally.

The bandwidth of subband divisionin has not been explained so far, however, there are several methods. For example, most common one is a uniform division whose final subband bandwidths are all equal.

Figure 4A:
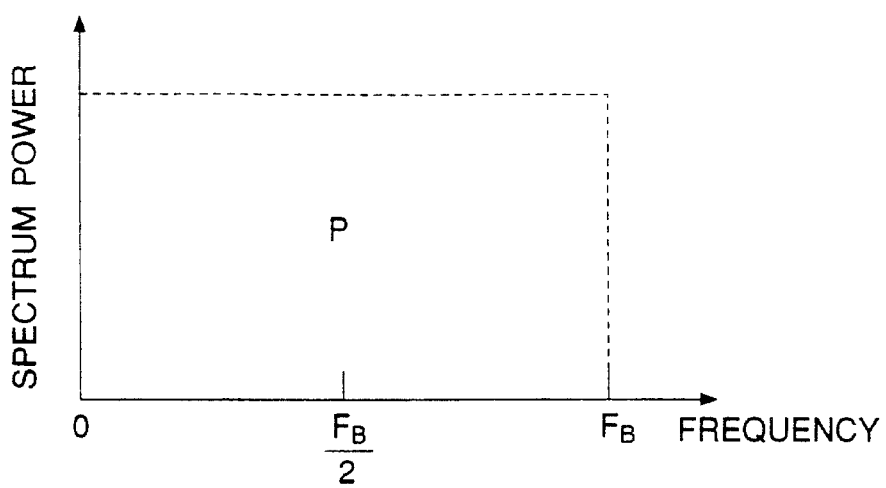
FIG. 4A, FIG. 4B and FIG. 4C are block diagrams to explain uniform subband division.
Figure 4B:
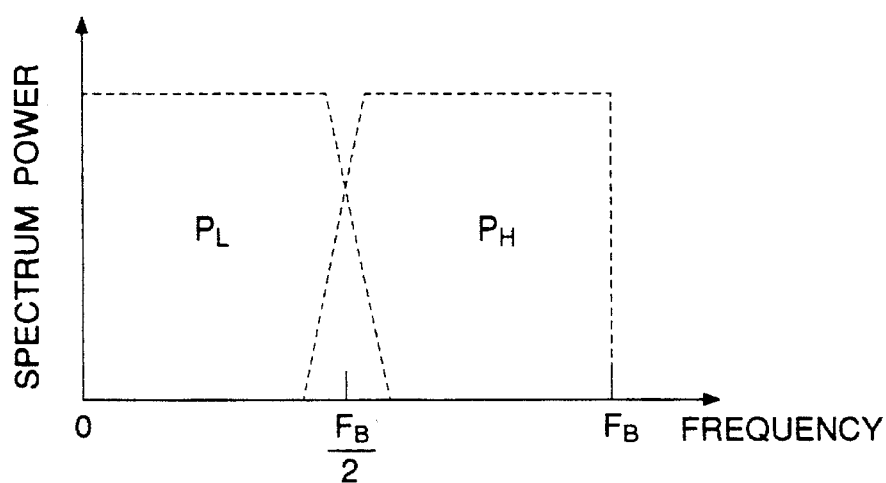
Figure 4C:
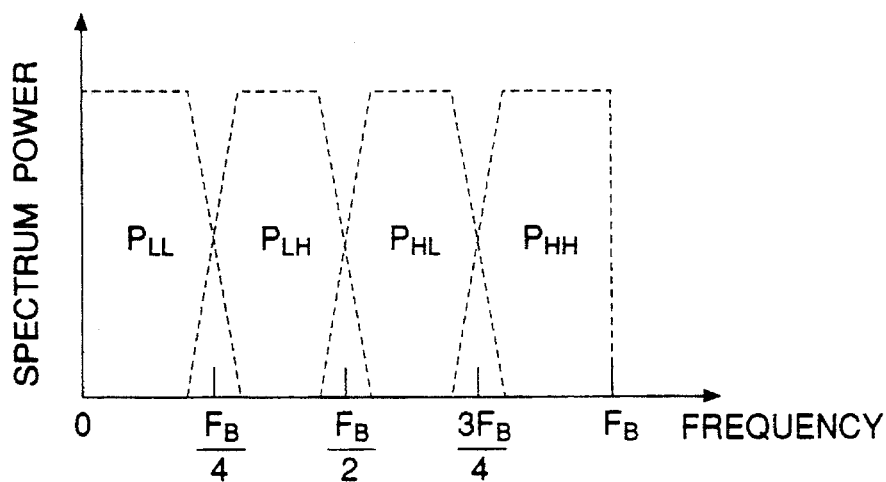

A two-and a four band case are shown in FIG. 4A, FIG. 4B and FIG. 4C. An input signal of a bandwidth $F_B$ is shown in FIG. 4A, FIG. 4A divided into 2 bnds is shown in FIG. 4B and FIG. 4A divided into 4 bands is shown in FIG. 4C. In other words, the subband bandwidth of FIG. 4B is $F_B/2$ and that of FIG. 4C is $F_B/4$.

Figure 5A:
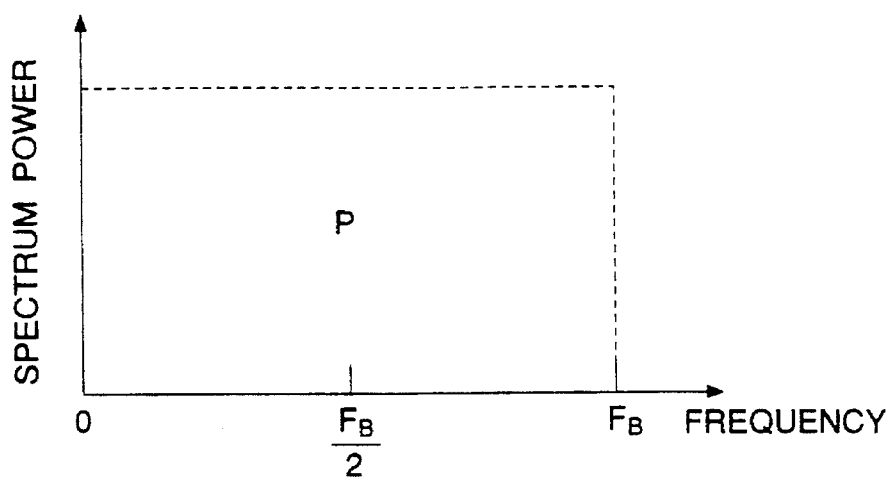
FIG. 5A, FIG. 5B and FIG. 5C are block diagrams to explain uniform subband division.
Figure 5B:
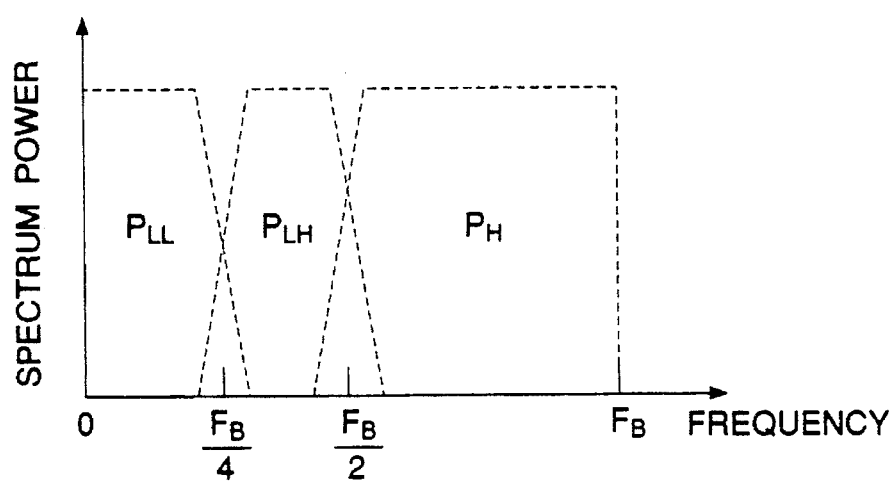

In contrast to uniform division, there is nonuniform division whose final subband bandwidths are not equal each other. FIG. 5B shows an example of a nonuniform division in which the bandwidth of the 2 lowest bands is $F_B/4$ and that of the high band is $F_B/2$ that is twice the bandwidth in the low band. Such nonuniform division is called an octave structure, which has a narrower bandwidth in lower bands and the bandwidth of a high band is integer multiple of the bandwidth in the low band. In general, acoustic signals contain strong spectrum components in low bands, and spectrum components in high bands are equally distributed with small powers. Furthermore, spectrum distribution in a subband becomes uniform by splitting into subbands, resulting in shorter convergence time of splitting into subband adaptive filters. An octave structure provides that spectrum distribution effectively with the same number of subbands.

Figure 5C:
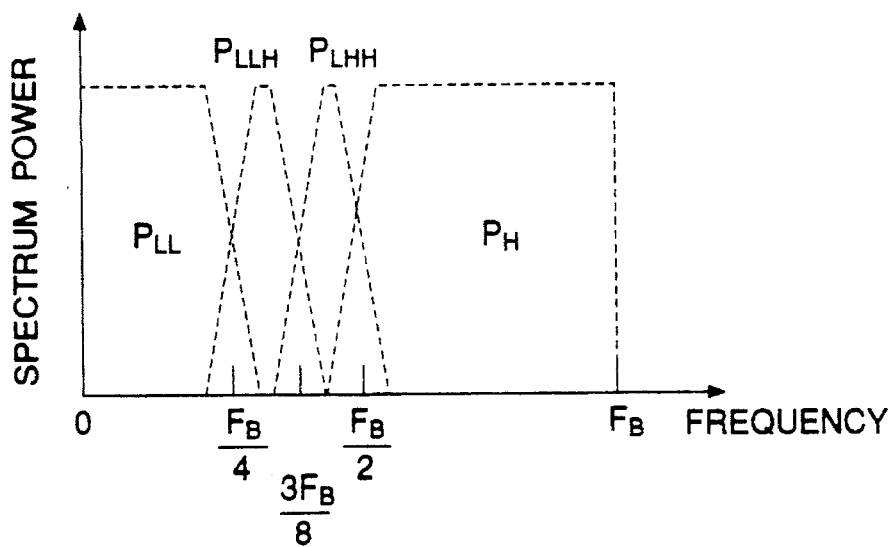

FIG. 5C is an example of nonuniform division whose bandwidth in a low band is $F_B/4$, that in the middle two-band is $F_B/8$ and that in the high band is $F_B/2$. With a combination of three-structured filter banks or a polyphase filter bank, such an irregular nonuniform division can easily be realized.

In addition, a design method for a nonuniform division with an arbitrary ratio of the bandwidths is reported in the proceedings of the 6-th digital signal processing symposium, pp.264–274, November 1991 (hereinafter referred to as Paper 6).

Furthermore, an oversampling method that decimates by a smaller factor than that of the ratio of the subband bandwidth and the full-band bandwidth is also reported in Paper 1.

The present invention can correspond to all of the above-mentioned configurations because it gives no restriction on the configurations of the analysis filter banks 3, 4 and the synthesis filter bank 5.

Next, the second embodiment of the present invention is explained.

Figure 6:
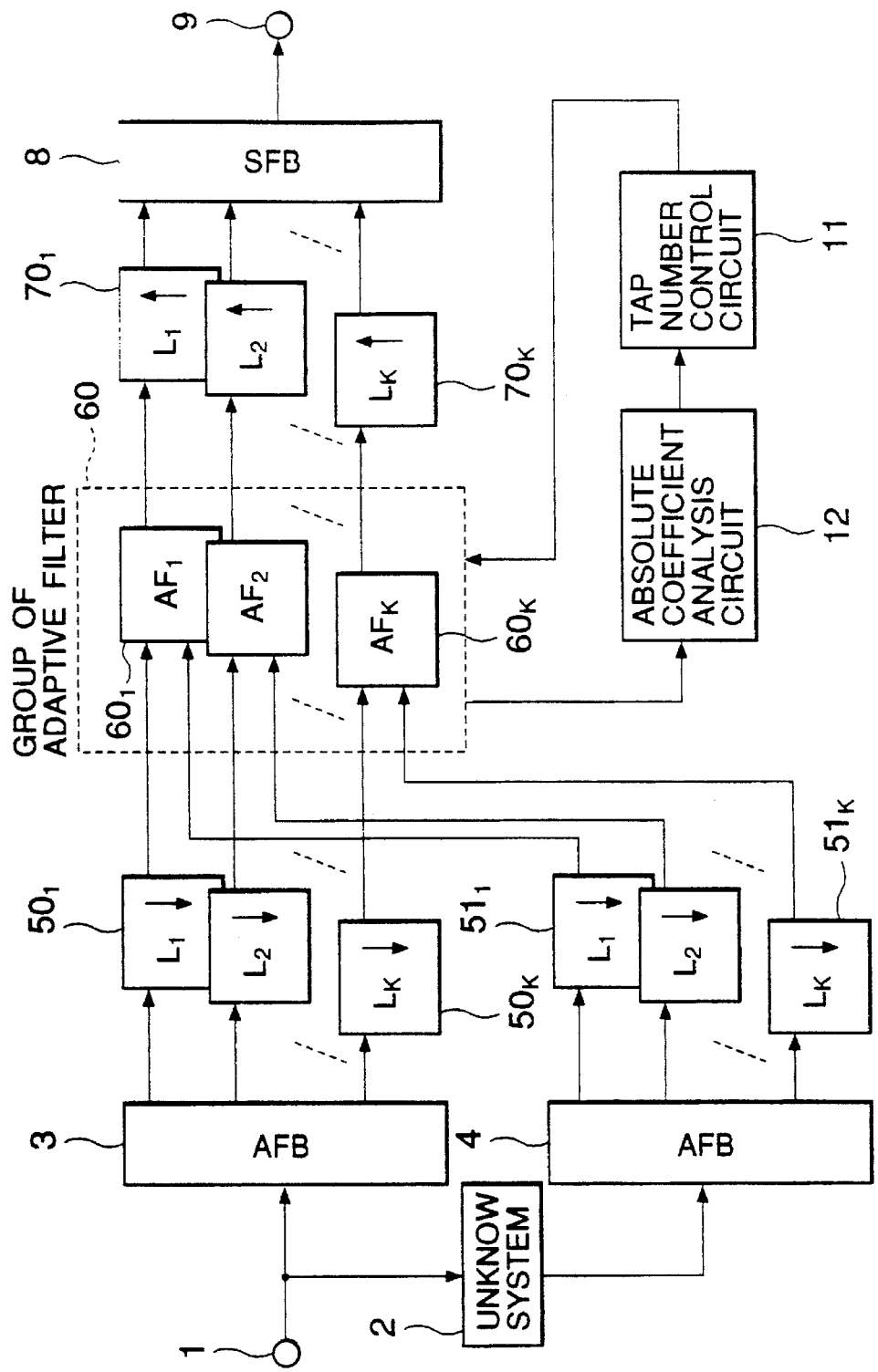
FIG. 6 is a block diagram showing the second embodiment of the present invention.

FIG. 6 is a block diagram showing the second embodiment of the present invention.

In the second embodiment, an absolute coefficient analysis circuit 12 is provided instead of the squared coefficient analysis circuit 10 in the first embodiment of the present invention.

Absolute coefficient analysis circuit 12 calculates mathematical expressions (8) and (9) based on the coefficients values output from the adaptive filters, and outputs the results to tap number control circuit 11.

$$\sum_{i=1}^{K} \sum_{j=N_i-P+1}^{N_i} |C_{i,j}| \tag{8}$$

$$\sum_{j=N_i-P+1}^{N_i} |C_{i,j}| \tag{9}$$

The tap number control circuit 11 calculates the mathematical expression (10) based on the supplied data.

$$N_{i,k+1} = N_{i,k} - R + INT\left[KR \times \frac{\sum_{j=N_i-P+1}^{N_i} |c_{i,j}|}{\sum_{i=1}^{K} \sum_{j=N_i-P+1}^{N_i} |c_{i,j}|}\right] \tag{10}$$

Next, similarly to the first embodiment it adjusts the number of taps, and outputs the result to adaptive filter $60_i$ (i=1, 2, ..., k). The configuration and operation hereinafter are the same as the first embodiment, so the explanation is omitted.

The third embodiment of the present invention is explained.

Figure 7:
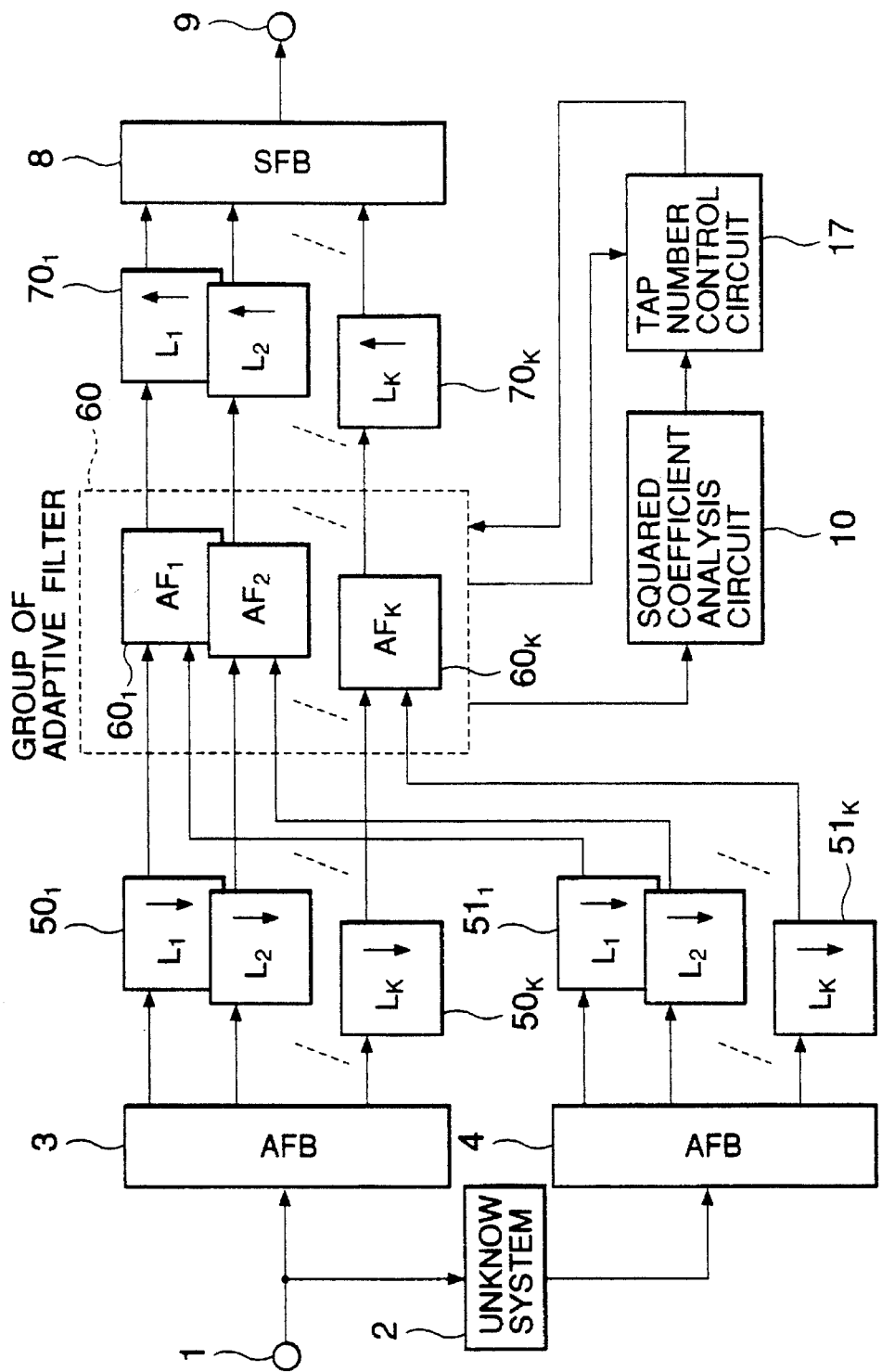
FIG. 7 is a block diagram showing the third embodiment of the present invention.

FIG. 7 is a block diagram showing the third embodiment of the present invention.

In the third embodiment, the second tap number control circuit 17 is provided instead of tap number control circuit 11 in the first embodiment of the present invention.

In addition to the signal from squared coefficient analysis circuit 10, the powers of subband reference signals are supplied to tap number control circuit 17 from each adaptive filter $60_i$ (i=1, 2, ..., k).

Assuming that the power of the i-th subband reference signal is $v_i$ (i=1, 2, ..., k), the tap number control circuit calculates the following mathematical expression.

$$N_{i,k+1} = N_{i,k} - R + INT\left[\frac{v_i}{\sum_{i=1}^{N} v_i} \times KR \times \frac{\bar{c}_i^T \bar{c}_i}{\text{trace}\{\bar{c}\}}\right] \quad (11)$$

In this case, the tap number of each subband also depends on the power of the subband reference signal, many taps are allocated to subbands having large signal power.

The configuration and operation hereinafter are the same as the first embodiment, so the explanation is omitted.

Next, the fourth embodiment of the present invention is explained.

Figure 8:
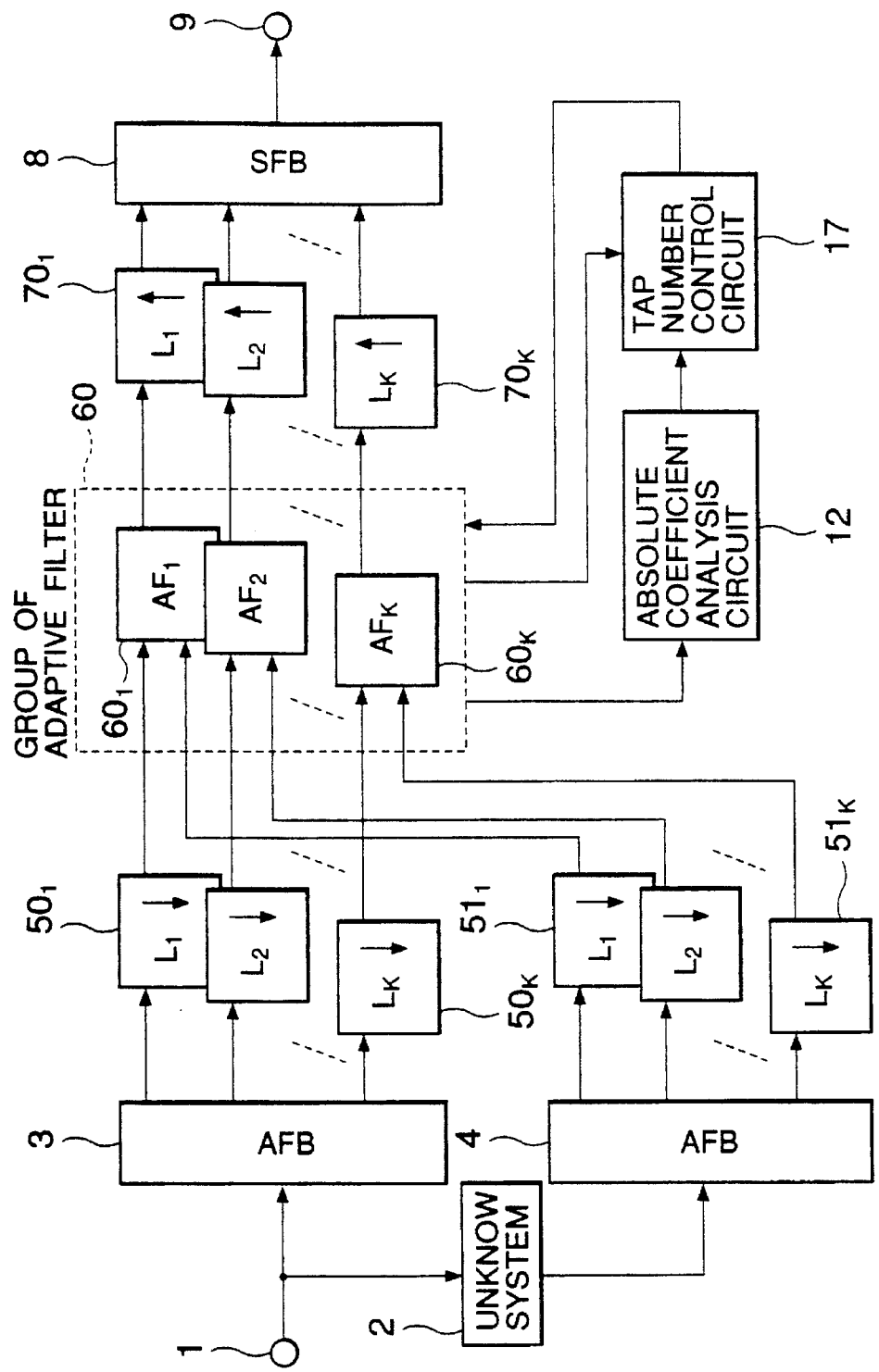
FIG. 8 is a block diagram showing the fourth embodiment of the present invention.

FIG. 8 is a block diagram showing the fourth embodiment of the present invention.

In the fourth embodiment, the absolute coefficient analysis circuit 12 is provided instead of squared coefficient analysis circuit 10 in the third embodiment of the present invention.

A signal from absolute coefficient analysis circuit and the powers of the subband reference signal from each adaptive filer $60_i$ (i=1, 2, ..., k) are supplied to tap number control circuit 17.

Tap number control circuit 17 calculates the mathematical expression (12).

$$N_{i,k+1} = N_{i,k} - R + \quad (12)$$

$$INT\left[\frac{v_i}{\sum_{i=1}^{N} v_i} \times KR \times \frac{\sum_{j=N_i-P+1}^{N_i} |c_{i,j}|}{\sum_{i=1}^{K}\sum_{j=N_i-P+1}^{N_i} |c_{i,j}|}\right]$$

Next, it adjusts the number of taps and outputs the result to adaptive filter $60_i$ (i=1, 2, ..., k).

The operation hereinafter is the same as the above-mentioned embodiment, so the explanation is omitted.

It is to be noted that the power of the subband reference signal from each adaptive filter $60_i$ (i=1, 2, ..., k) is supplied to tap number control circuit 17 in the third embodiment and the fourth embodiment. However, it is possible to make it work similarly if an absolute value of the subband reference signal from each adaptive filter $60_i$ (i=1, 2, ..., k) is supplied.

Auuming the absolute value of the subband reference signal in the adaptive filter $60_i$ is $w_i$, for example, the number of taps is controled by the following mathematical expressions (13) and (14) corresponding to mathematical expressions (11) and (12).

$$N_{i,k+1} = N_{i,k} - R - INT\left[\frac{w_i}{\sum_{i=1}^{N} w_i} \times KR \times \frac{\bar{c}_i^T \bar{c}_i}{\text{trace}\{\bar{c}\}}\right] \quad (13)$$

$$N_{i,k+1} = N_{i,k} - R + \quad (14)$$

$$INT\left[\frac{w_i}{\sum_{i=1}^{N} w_i} \times KR \times \frac{\sum_{j=N_i-P+1}^{N_i} |c_{i,j}|}{\sum_{i=1}^{K}\sum_{j=N_i-P+1}^{N_i} |c_{i,j}|}\right]$$

The operation hereinafter is the same as the above-mentioned embodiment, so the explanation is omitted.

Next, the fifth embodiment of the present invention is explained.

Figure 9:
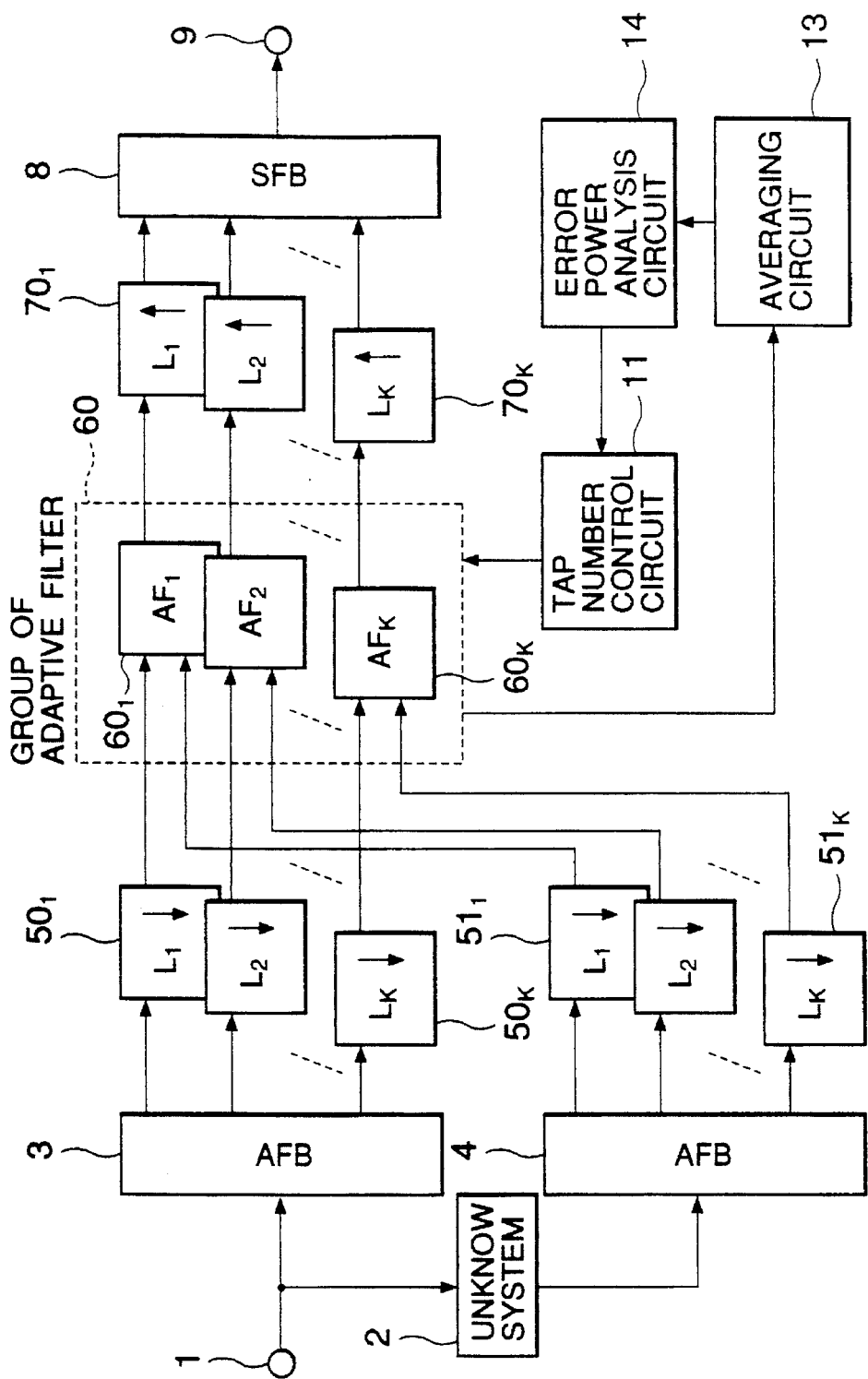
FIG. 9 is a block diagram showing the fifth embodiment of the present invention.

FIG. 9 is a block diagram showing the fifth embodiment of the present invention.

In the fifth embodiment, averaging circuit 13 and error power analysis circuit 14 are provided instead of the squared coefficient analysis circuit 10 in the first embodiment of the present invention.

A subband error signal instead of a coefficient value is supplied to averaging circuit 13 from each adaptive filter. Letting a subband error signal of each adaptive filter $60_i$ be $e_i$, e expressed by the mathematical expression (15) is supplied to averaging circuit 13.

$$e = [e_1 e_2 \ldots e_N]^T \quad (15)$$

Averaging circuit 13 which received e calculates a mean error power vector $\bar{e}_p$ expressed by the mathematical expression (16).

$$\bar{e}_p = [\bar{e}_1^2 \bar{e}_2^2 \ldots \bar{e}_N^2]^T \quad (16)$$

Consequently, the mean error power vector $\bar{e}_p$ is transmitted to error power analysis circuit 14.

Error power analysis circuit 14 compares each element of the mean error power vector $\bar{e}_p$.

For controlling the number of taps, various methods can be considered. For example, the number of taps can be controlled by the following method.

First, the maximum value and the minimum value are detected from among the elements of mean error power vector $\bar{e}_p$. Next, the number of taps of the filter in a subband corresponding to the minimum value is reduced by R (number of taps). Likewise, the number of taps of the adaptive filter in a subband corresponding to the maximum value is increased by R. This is because a small error indicates that the number of taps is sufficient and a large error indicates that the number of taps is insufficient. By repeating this operation, error powers of subbands are averaged.

The tap numbers corresponding to respective subbands obtained in the above evaluation operation are transmitted to tap number control circuit 11.

Tap number control circuit 11 transmits the tap number of the adaptive filter $60_i$ (i=1, 2, ..., k) supplied from error power analysis circuit 14 to adaptive filter $60_i$ (i=1, 2, ..., k).

The operation hereinafter is the same as that explained by FIG. 1 and FIG. 6.

It is to be noted that the method explained above is applicable to control using squared coefficients or absolute coefficients, which were explained by FIG. 1 and FIG. 6.

Next, the sixth embodiment of the present invention is explained.

Figure 10:
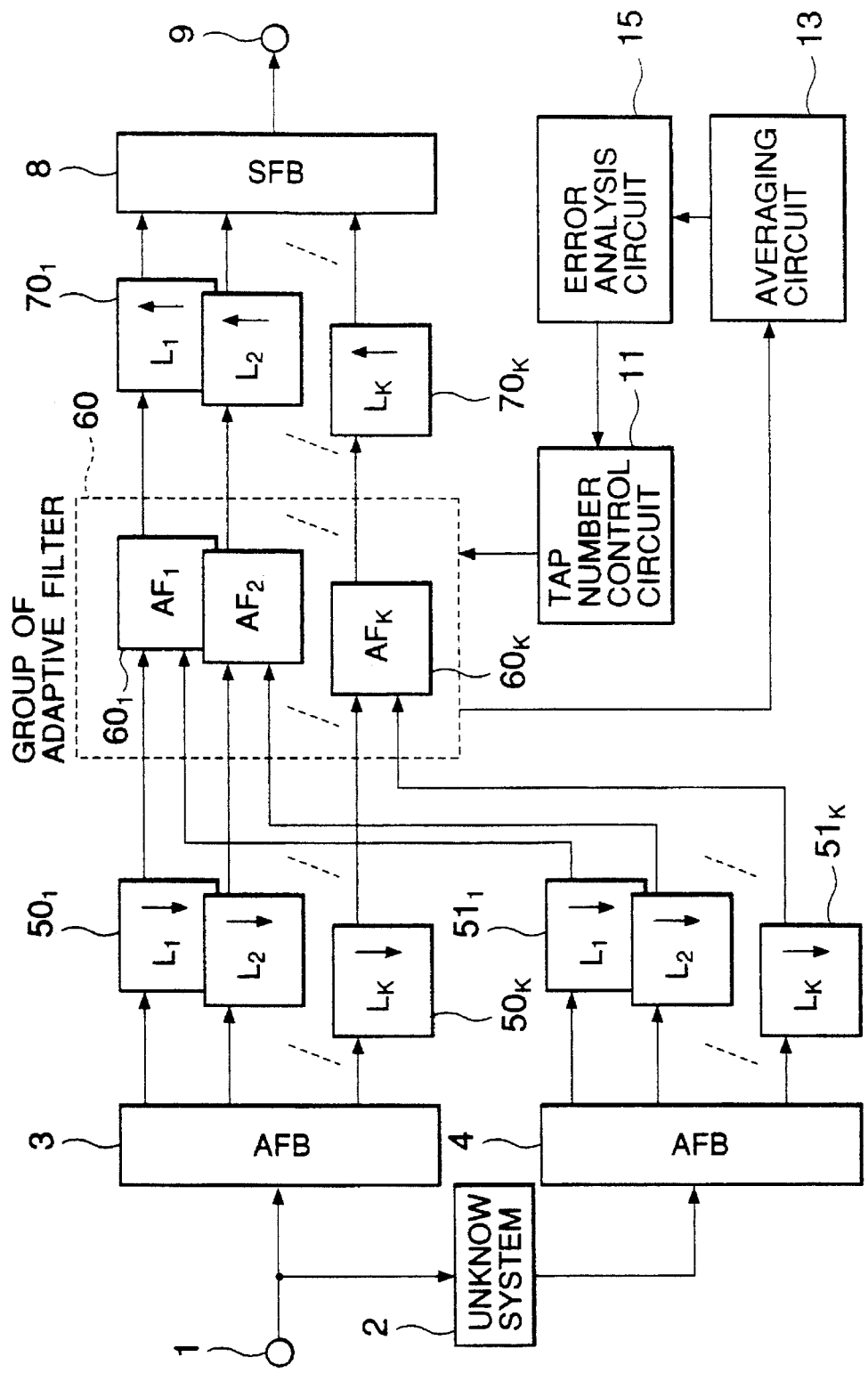
FIG. 10 is a block diagram showing the sixth embodiment of the present invention.
Figure 11:
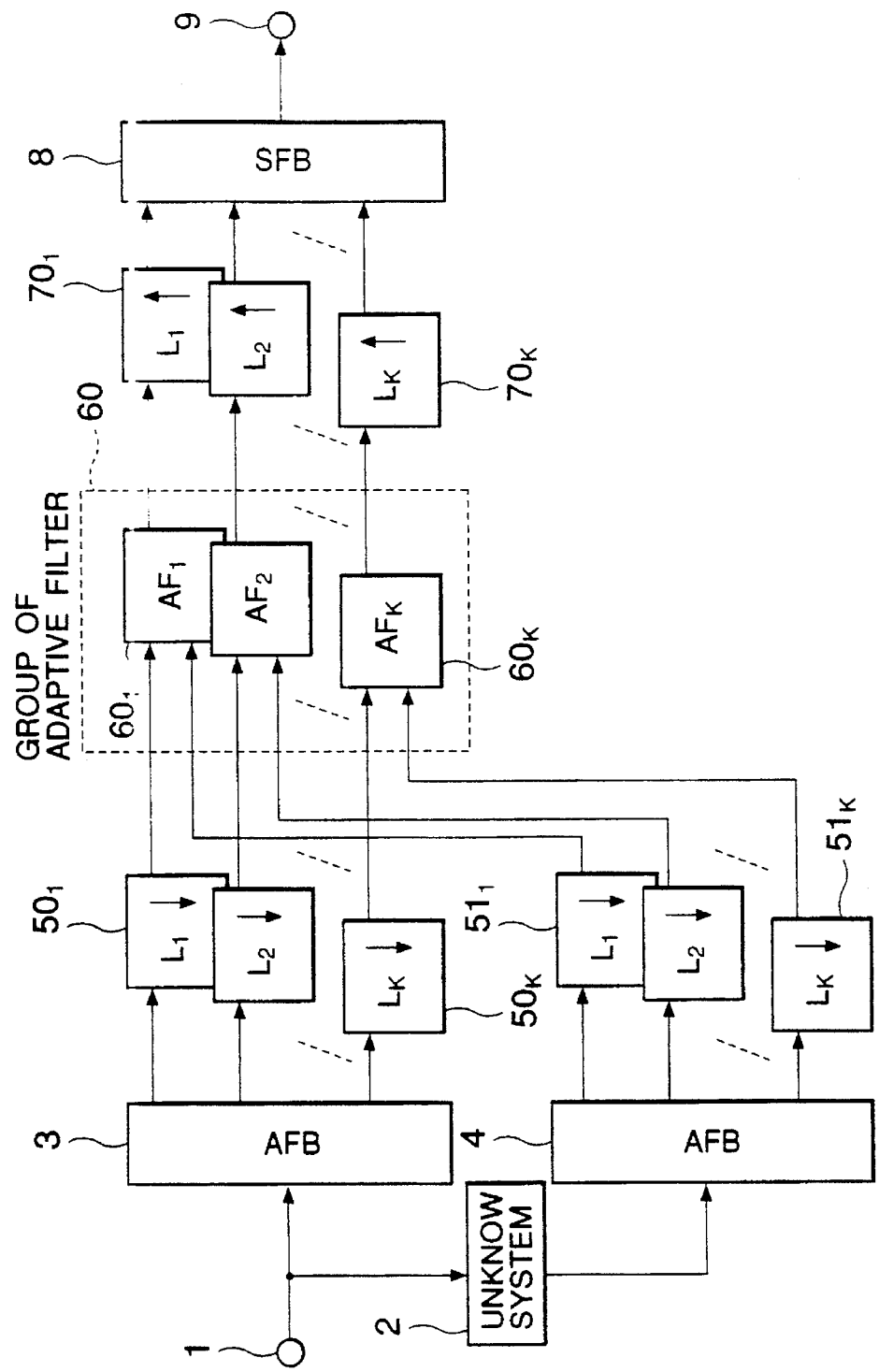
FIG. 11 is a block diagram showing an example of prior art.

FIG. 10 is a block diagram showing the sixth embodiment of the present invention.

In the sixth embodiment, averaging circuit 13 and the error power analysis circuit 15 are provided instead of squared coefficient analysis circuit 10 in the first embodiment.

Averaging circuit 13 calculates a mean error power vector $\bar{e}_M$ expressed by the mathematical expression (17).

$$\bar{e}_M = [|\bar{e}_1||\bar{e}_2| \ldots |\bar{e}_N|]^T \quad (17)$$

Consequently, the resulted mean error is transmitted to error analysis circuit 15. Error analysis circuit 15 compares each element of the received mean error vector $\bar{e}_M$. Here, the same operation as that in FIG. 9 is performed except that averaging circuit 13 performs the mathematical expression (17) corresponding to the mathematical expression (16), and that error analysis circuit 15 compares the obtained mean values.

The present invention was explained using the first embodiment to the sixth embodiment, however, it is easy to obtain a new configuration by exchanging elements between respective embodiments. It is such an example to evaluate a squared coefficient or an absolute coefficient value after an averaging operation in FIG. 1 or FIG. 2.

It is to be noted that the embodiments of the present invention has been explained using an echo canceller as an example, however, the principle of the present invention can be applied to noise cancellers, howling cancellers, adaptive equalizers, and the like. Moreover, many algorithms in addition to the algorithm referred to as an example here can be applied to tap coefficient adaptation.

What is claimed is:

1. A method of identifying an unknown system with subband adaptive filters comprising:
    (a) generating a plurality of subband signals by subbanding an input signal to the unknown system;
    (b) generating a plurality of subband reference signals by subbanding an output signal from the unknown system;
    (c) generating a plurality of replica signals corresponding to the subband reference signals by filtering the subband signals with the subband adaptive filters;
    (d) generating a plurality of subband error signals based on differences between the subband reference signals and the replica signals;
    (e) updating coefficient values of the subband adaptive filters based on the subband error signals; and
    (f) controlling a number of taps of the subband adaptive filters based on the updated coefficient values.

2. The method of identifying an unknown system as recited in claim 1, wherein said controlling step comprises controlling the number of taps of the subband adaptive filters based on squares of the updated coefficient values.

3. The method of identifying an unknown system as recited in claim 1, wherein said controlling step comprises controlling the number of taps of the subband adaptive filters based on averages of squares of the updated coefficient values.

4. The method of identifying an unknown system as recited in claim 1, wherein said controlling step comprises controlling the number of taps of the subband adaptive filters based on absolute values of the updated coefficient values.

5. The method of identifying an unknown system as recited in claim 1, wherein said controlling step comprises controlling the number of taps of the subband adaptive filters based on averages of absolute values of the updated coefficient values.

6. The method of identifying an unknown system as recited in claim 1, wherein said controlling step comprises:
    calculating respective squares of the updated coefficient values and a sum of the squares for each of the subband adaptive filters;
    calculating values by dividing the calculated squares by the calculated sum for each of the subband adaptive filters;
    calculating the number of taps of the subband adaptive filters based on the calculated values for each of the subband adaptive filters; and
    controlling the number of taps of the adaptive filters based on the calculated number of taps for each of the subband adaptive filters.

7. The method of identifying an unknown system as recited in claim 1, wherein said controlling step comprises:
    calculating respective absolute values of the updated coefficient values and a sum of the absolute values for each of the subband adaptive filters;
    calculating values by dividing the calculated absolute values by the calculated sum for each of the subband adaptive filters;
    calculating the number of taps of the subband adaptive filters based on the calculated values for each of the subband adaptive filters; and
    controlling the number of taps of the subband adaptive filters based on the calculated number of taps for each of the subband adaptive filters.

8. The method of identifying an unknown system as recited in claim 1, wherein said controlling step comprises controlling the number of taps of the subband adaptive filters based on the updated coefficient values and powers of the subband reference signals.

9. The method of identifying an unknown system as recited in claim 1, wherein said controlling step comprises controlling the number of taps of the subband adaptive filters based on the updated coefficient values and absolute values of the subband reference signals.

10. The method of identifying an unknown system as recited in claim 1, wherein said controlling step comprises:
    calculating respective squares of the updated coefficient values and a sum of the squares for each of the subband adaptive filters;
    calculating first values by dividing the calculated squares by the calculated sum for each of the subband adaptive filters;
    calculating powers of the subband reference signals corresponding to respective adaptive filters and a sum of the powers;
    calculating second values by dividing the calculated powers by the calculated sum for each of the adaptive filters;
    calculating the number of taps of the adaptive filters based on the first values and the second values; and
    controlling the number of taps of the adaptive filters based on the calculated number of taps for each of the subband adaptive filters.

11. The method of identifying an unknown system as recited in claim 1, wherein said controlling step comprises:
    calculating respective absolute values of the updated coefficient values and a sum of the absolute values for each of the subband adaptive filers;
    calculating first values by dividing the calculated absolute values by the calculated sum for each of the subband adaptive filters;
    calculating powers of the subband reference signals corresponding to respective adaptive filters and a sum of the powers;
    calculating second values by dividing the calculated powers by the calculated sum for each of the adaptive filters;
    calculating the number of taps of the adaptive filters based on the first values and the second values; and
    controlling the number of taps of the adaptive filters based on the calculated number of taps for each of the subband adaptive filters.

12. A method of identifying an unknown system with subband adaptive filters comprising:
    (a) generating a plurality of subband signals by subbanding an input signal to the unknown system;
    (b) generating a plurality of subband reference signals by subbanding an output signal from the unknown system;
    (c) generating a plurality of replica signals corresponding to the subband reference signals by filtering the subband signals with the subband adaptive filters;

(d) generating a plurality of subband error signals based on differences between the subband reference signals and the replica signals;

(e) updating coefficient values of the subband adaptive filters based on the subband error signals; and (f) controlling a number of taps of the subband adaptive filters based on the subband error signals.

13. The method of identifying an unknown system as recited in claim 12, wherein said controlling step comprises controlling the number of taps of the subband adaptive filters based on squares of the subband error signals.

14. The method of identifying an unknown system as recited in claim 12, wherein said controlling step comprises controlling the number of taps of the subband adaptive filters based on averages of squares of the subband error signals.

15. The method of identifying an unknown system as recited in claim 12, wherein said controlling step comprises controlling the number of taps of the subband adaptive filters based on absolute values of the subband error signals.

16. The method of identifying an unknown system as recited in claim 12, wherein said controlling sep comprises controlling the number of taps of the subband adaptive filters based on averages of absolute values of the subband error signals.

17. The method of identifying an unknown system as recited in claim 12, wherein said controlling step comprises:

calculating a maximum power and a minimum power of the subband error signals for each of the subband adaptive filters; and increasing the number of taps of the adaptive filters corresponding to the subband error signal having the maximum power by R1, where R1 is an integer, and decreasing the number of taps of the adaptive filters corresponding to the subband error signal having the minimum power by R2, wherein R2 is an integer.

18. The method of identifying an unknown system as recited in claim 12, wherein said controlling step comprises:

calculating respective powers of the subband error signals for each of the subband adaptive filters and a sum of the powers;

calculating values by dividing the calculated powers by the calculated sum for each of the subband adaptive filters;

calculating the number of taps of the subband adaptive filters based on the calculated values for each of the subband adaptive filters; and controlling the number of taps of the subband adaptive filters based on the calculated number of taps for each of the subband adaptive filters.

19. A device for identifying an unknown system comprising:

first analysis filter bank means for generating a plurality of subband signals by subbanding an input signal to the unknown system;

second analysis filter bank means for generating a plurality of subband reference signals by subbanding an output signal from the unknown system;

a plurality of adaptive filters, each of said adaptive filters generating a replica signal corresponding to the subband reference signals by filtering the subband signals, and outputting coefficient values for taps of said adaptive filters;

a plurality of subtracters, each of said subtracters calculating a difference between the subband reference signals and the replica signal and outputting the difference as a subband error signal;

a plurality of coefficient value adaptation means for updating coefficient values of the taps of said adaptive filters based on the subband error signal;

analyzer means for analyzing the coefficient values and outputting results; and tap number control means for calculating the number of taps for each of said adaptive filters based on the results output by said analyzer means, and for controlling the number of taps of said adaptive filters based on the calculated number of taps for each of said adaptive filters.

20. The device for identifying an unknown system of claim 19, wherein:

said analyzer means comprises means for calculating respective squares of the coefficient values and a sum of the squares for each of said adaptive filters, and wherein said tap number control means comprises means for calculating a value by dividing the calculated squares by the calculated sum of the squares for each of said adaptive filters, and means for controlling the number of taps based on the calculated value for each of said adaptive filters.

21. The device for identifying an unknown system of claim 19, wherein said analyzer means comprises means for calculating respective absolute values of the coefficient values and a sum of the absolute values, and wherein said tap number control means comprises means for calculating values by dividing the calculated absolute values by the calculated sum of the absolute values for each of said adaptive filters, and means for controlling the number of taps based on the calculated values for each of said adaptive filters.

22. The device for identifying an unknown system of claim 19, wherein said analyzer means comprises means for calculating respective squares of the subband error signals corresponding to said adaptive filters and a sum of the squares, and wherein said tap number control means comprises means for calculating values by dividing the calculated squares by the calculated sum of the squares for each of said adaptive filters, means for calculating tap numbers of said adaptive filters based on the calculated values, and means for outputting the tap numbers as control signals.

23. The device for identifying an unknown system of claim 19, wherein said analyzer means comprises means for calculating respective absolute values of the subband error signal for each of said adaptive filters and a sum of the absolute values, and wherein said tap number control means comprises means for calculating values by dividing the calculated absolute values by the calculated sum of the absolute values for each of said adaptive filters, means for calculating tap numbers of said adaptive filters based on the calculated values, and means for outputting the tap numbers as control signals.

24. The device for identifying an unknown system as recited in claim 19, wherein said tap number control means comprises means for calculating a tap number of said adaptive filters based on the results output from said analyzer means and data on the subband reference signals, means for generating a tap number control signal, and means for outputting the tap number control signal, and wherein said device further comprises tap number updating means for receiving the tap number control signal output from said tap number control means.

25. The device for identifying an unknown system as recited in claim 24, wherein said tap number control means comprises means for receiving powers of respective ones of the subband reference signals corresponding to said adaptive filters, means for calculating a sum of the received powers and for calculating values by dividing the received powers of respective ones of the subband reference signals by the sum of the received powers for each of said adaptive filters, means for calculating the tap number of said adaptive filters based on the calculated values and the results output from said analyzer means, means for generating the tap number control signal, and means for outputting the generated signal to said tap number updating means.

26. The device for identifying an unknown system with a subband adaptive filter of claim 24, wherein said tap number control means comprises means for receiving absolute values of respective ones of the subband reference signals corresponding to said adaptive filters, means for calculating a sum of the absolute values and for calculating values by dividing the received absolute values of respective ones of the subband reference signals by the sum of the absolute values for each of said adaptive filters, means for calculating a tap number of said subband adaptive filters based on the calculated values and the results output from said analyzer means, means for generating the tap number control signal, and means for outputting the generated signal to said tap number updating means.

27. The device for identifying an unknown system as recited in claim 19, further comprising a tap number updating means for updating the tap numbers, said tap number updating means comprising generator means for generating a sequence of numbers consisting of 0's and 1's based on the tap number control signals from said tap number control means, and a plurality of switching means for switching taps ON and OFF at each of said adaptive filters, wherein said tap control means controls the switching means to turn the taps ON when the switching means detects the number 1 in the sequence of numbers, and turns the taps OFF when the switching means detects the number 0 in the sequence of numbers.

28. The device for identifying an unknown system as recited in claim 19, further comprising an averaging circuit for averaging data to be analyzed by said analyzer means.

29. The device for identifying an unknown system as recited in claim 19, further comprising:

a first group of decimation circuits for decimating the subband signals and transmitting the subband signals to said adaptive filters; and a second group of decimation circuits for decimating the subband reference signals and transmitting the subband reference signals to said subtracters.

* * * * *